United States Patent
Sakai et al.

(10) Patent No.: US 8,025,205 B2
(45) Date of Patent: Sep. 27, 2011

(54) ELECTRONIC COMPONENT MOUNTING METHOD

(75) Inventors: Tadahiko Sakai, Fukuoka (JP); Hideki Eifuku, Fukuoka (JP); Osamu Suzuki, Niigata (JP); Satomi Kawamoto, Niigata (JP)

(73) Assignees: Panasonic Corporation, Osaka (JP); Namics Corporation, Niigata (JP)

( * ) Notice: Subject to any disclaimer, the term of this patent is extended or adjusted under 35 U.S.C. 154(b) by 474 days.

(21) Appl. No.: 12/090,528

(22) PCT Filed: Oct. 18, 2006

(86) PCT No.: PCT/JP2006/320742
§ 371 (c)(1),
(2), (4) Date: Apr. 17, 2008

(87) PCT Pub. No.: WO2007/046416
PCT Pub. Date: Apr. 26, 2007

(65) Prior Publication Data
US 2009/0288767 A1    Nov. 26, 2009

(30) Foreign Application Priority Data
Oct. 20, 2005 (JP) .................................. 2005-306122

(51) Int. Cl.
*B23K 31/00* (2006.01)
(52) U.S. Cl. .................... 228/180.22; 156/295
(58) Field of Classification Search ............. 228/180.22; 156/295
See application file for complete search history.

(56) References Cited

U.S. PATENT DOCUMENTS

| | | | |
|---|---|---|---|
| 5,892,289 A * | 4/1999 | Tokuno | 257/783 |
| 6,436,331 B1 | 8/2002 | Kuno et al. | |
| 2003/0096453 A1 | 5/2003 | Wang et al. | |
| 2003/0132528 A1 | 7/2003 | Liang et al. | |
| 2004/0234689 A1 | 11/2004 | Morganelli et al. | |

FOREIGN PATENT DOCUMENTS

| | | |
|---|---|---|
| JP | 6-333985 | 12/1994 |
| JP | 7-273147 | 10/1995 |

(Continued)

OTHER PUBLICATIONS

Machine Translation of JP 11-112476, which originally published Apr. 28, 1998.*

(Continued)

*Primary Examiner* — Jessica L Ward
*Assistant Examiner* — Nicholas D'Aniello
(74) *Attorney, Agent, or Firm* — Wenderoth, Lind & Ponack, L.L.P.

(57) ABSTRACT

By an electronic component mounting method for electrically connecting bumps to board electrodes, in a contact process for placing a thermosetting resin in a liquid glob state on the board surface and bringing the lower surface of the electronic component into contact with the thermosetting resin, the bumps are pressurized against the electrodes in positional alignment in a liquid glob distribution state where one portion of the liquid glob is arranged inside an electronic component mounting region and a remaining portion greater in liquid measure than the one portion is arranged outside the electronic component mounting region. The thermosetting resin enters into a gap between the electronic component and the board by capillarity in a thermocompression bonding process. This prevents voids occurring in the sealing resin, reinforces bonded portions of bumps and electrodes with thermally cured thermosetting resin, thereby preventing bonded portion breakage due to thermal stress generated during cooling.

6 Claims, 7 Drawing Sheets

FOREIGN PATENT DOCUMENTS

| | | |
|---|---|---|
| JP | 10-112476 | 4/1998 |
| JP | 11-087420 | 3/1999 |
| JP | 2000-012617 | 1/2000 |
| JP | 2000-058597 | 2/2000 |
| JP | 2001-250845 | 9/2001 |

OTHER PUBLICATIONS

Machine translation of JP 2000-058597, which originally published Feb. 2000.*

Machine Translation of JP 10-112476, which originally published Apr. 28, 1998.*

International Search Report issued Jan. 16, 2007 in the International (PCT) Application of which the present application is the U.S. National Stage.

International Preliminary Report including Written Opinion of the International Searching Authority (all in English) issued Apr. 22, 2008 in the International Application of which the present application is in the U.S. National Stage.

Supplementary European Search Report issued Apr. 26, 2011 in EP 06 82 1936, which is a foreign counterpart to the present application.

* cited by examiner

ELECTRONIC COMPONENT MOUNTING METHOD

TECHNICAL FIELD

The present invention relates to an electronic component mounting method for metallically bonding bumps formed on an electronic component to electrodes of a board.

BACKGROUND ART

An electronic component on the lower surface of which bumps for connection are provided, such as a flip chip or a CSP (Chip Size Package), are mounted by metallically bonding the bumps to the electrodes of a board. Then, in the mounting process, a gap between the electronic component and the board is generally sealed with a thermosetting resin such as epoxy resin in the mounting process (refer to, for example, Japanese patent application publication No. H06-333985). This has an effect that bonding reliability after the mounting can be secured by reducing thermal stress generated at the bonded portions of the bumps and the electrodes in an electronic-component-mounted board due to a heat cycle during use.

As a method of resin sealing, a method by so-called "postcoating" for injecting a thermosetting resin into the gap between the electronic component and the board after the metal bonding of the bumps and the electrodes (refer to, for example, Japanese patent application publication No. H07-273147) and a method by so-called "precoating" for previously applying a thermosetting resin onto the board prior to the mounting of the electronic component on the board (refer to, for example, Japanese patent application publication No. 2000-58597) have conventionally been known.

However, even when the resin sealing is performed by either the "postcoating" or "precoating" method described above, the following problems occur due to characteristics inherent in each of the methods. First, in the case of resin sealing by "postcoating", the resin is injected into the gap between the electronic component and the board after the bumps and the electrodes are metallically bonded together. This, therefore, has a defect that a reinforcing effect of the resin sealing cannot be obtained in the metal bonding process.

That is, a thermal stress caused by an expansion coefficient difference between the board and the electronic component takes effect on the bonded portions of the bumps and the electrodes during cooling from the heated state at an elevated temperature in the metal bonding process to the normal temperature, and minute cracks and breakage sometimes occur in the bonded portions before the resin sealing is performed. Such a problem tends to occur as the bumps are reduced in size and pitch in accordance with the downsizing of electronic components and as lead-free solder is increasingly adopted in solder bonding of the bumps. This becomes a big problem in securing the bonding reliability.

Moreover, the resin sealing by "precoating" has a drawback that voids caused by air bubbles entering in the sealing resin tend to occur due to the pressurization of the electronic component against the board in a state in which the resin is applied onto the board. That is, the air bubbles in the gap sometimes remain as voids due to the spread of the resin in a state in which air is confined in the gap between the electronic component and the board, during the process that the resin previously supplied before the component mounting is spread by the lower surface of the electronic component.

Moreover, a solvent constituent and moisture in the resin are gasified during the heating in the metal bonding process, and the gasified gas remains as it is in the resin, similarly generating voids in a case that the resin is confined in the gap between the board and the electronic component in the metal bonding process. Such voids do not only impair the strength of the sealing resin as a resin reinforcement member, but also cause damage of the component as a consequence of breakage due to the expansion of the internal gas when it is heated after mounting. Therefore, it is desired to prevent the occurrence of voids as much as possible.

Furthermore, a resin including filler is often used as the resin material to adjust the physical properties (coefficient of linear expansion etc.) after bonding (curing). However, when such a resin is used for resin sealing by "precoating", there is problem that so-called "interposing" of the filler interposed between the electrodes and the bumps occurs, impairing the reliability after bonding. Accordingly, there is a restriction that a resin including filler cannot be used in the conventional method of "precoating".

As described above, it is difficult to sufficiently secure the reinforcing effect by resin sealing even when the resin sealing is achieved by either method of "postcoating" or "precoating" by the electronic component mounting method for metallically bonding the bumps to the electrodes and sealing the mounting gap between the electronic component and the board with resin. Therefore, an electronic component mounting method, which solves the problems and has excellent bonding reliability after mounting, is demanded.

An object of the present invention is to improve the above issues and to provide an electronic component mounting method, which is able to sufficiently secure the reinforcing effect by resin sealing and has excellent bonding reliability after mounting.

SUMMARY OF THE INVENTION

In order to accomplish these and other objects, the present invention has the following constitutions.

According to a first aspect of the present invention, there is provided an electronic component mounting method for electrically connecting bumps formed on an electronic component to electrodes formed in an electronic component mounting region on a board by metal bonding, comprising:

placing a liquid thermosetting resin in a liquid glob state on a surface of the board so that one portion of the thermosetting resin is arranged inside the electronic component mounting region and a remaining portion of a liquid measure of the thermosetting resin greater than that of the one portion is arranged outside the electronic component mounting region;

moving down a thermocompression bonding head which holds the electronic component to the board, and then bringing a bump formation surface of the electronic component into contact with the one portion of the thermosetting resin in the liquid glob state while pressurizing the bumps against the electrodes of the board;

carrying out metal bonding of the bumps and the electrodes by heating the electronic component by the thermocompression bonding head in a state in which the bumps are pressurized against the electrodes, while heating the thermosetting resin so that entry of the thermosetting resin in the liquid glob state into a gap between the board and the electronic component in the electronic component mounting region is promoted and thermosetting reaction of the thermosetting resin which has entered the gap is promoted, thereby bonding the electronic component to the board via cured thermosetting resin; and then moving the thermocompression bonding head away from the electronic component, thereby mounting the electronic component on the board.

According to a second aspect of the present invention, there is provided the electronic component mounting method as defined in the first aspect, wherein the one portion of the thermosetting resin in the liquid glob state is placed so as not to cover the electrodes of the board in the electronic component mounting region.

According to a third aspect of the present invention, there is provided the electronic component mounting method as defined in the first aspect, wherein the liquid thermosetting resin is placed by applying the thermosetting resin onto the surface of the board, and a shape of the liquid glob such that the one portion of the liquid glob is arranged in the electronic component mounting region and the remaining portion of the greater liquid measure of the thermosetting resin is arranged outside the electronic component mounting region is formed by the application of the thermosetting resin.

According to a fourth aspect of the present invention, there is provided the electronic component mounting method as defined in the third aspect, wherein the liquid glob of the thermosetting resin is formed by applying the thermosetting resin into an integrated shape comprising a liquid glob body portion arranged outside the electronic component mounting region and a tongue-shaped portion which projects from the liquid glob body portion and has an end portion reaching the inside of the electronic component mounting region.

According to a fifth aspect of the present invention, there is provided the electronic component mounting method as defined in the first aspect, wherein heating of the thermosetting resin by the thermocompression bonding head is continuously performed until the thermosetting resin is cured.

According to a sixth aspect of the present invention, there is provided an electronic component mounting method for electrically connecting bumps formed on an electronic component to electrodes formed in an electronic component mounting region of a board by metal bonding, comprising:

placing a liquid thermosetting resin in a liquid glob state on a surface outside the electronic component mounting region of the board;

moving down a thermocompression bonding head which holds the electronic component to the board, and then pressurizing the bumps against the electrodes of the board while flowing one portion of the liquid glob of the thermosetting resin placed outside the electronic component mounting region so that the one portion reaches inside of the electronic component mounting region thereby bringing the thermosetting resin of the one portion into contact with a bump formation surface of the electronic component;

carrying out metal bonding of the bumps and the electrodes by heating the electronic component by the thermocompression bonding head in a state in which the bumps are pressurized against the electrodes, while heating the thermosetting resin so that entry of the thermosetting resin in the liquid glob state into a gap between the board and the electronic component in the electronic component mounting region is promoted and thermosetting reaction of the thermosetting resin which has entered the gap is promoted, thereby bonding the electronic component to the board via cured thermosetting resin; and then moving the thermocompression bonding head away from the electronic component, thereby mounting the electronic component on the board.

According to a seventh aspect of the present invention, there is provided the electronic component mounting method as defined in the sixth aspect, wherein the contact of the thermosetting resin with the electronic component is achieved by bringing the one portion of the thermosetting resin which has flowed into the electronic component mounting region into contact with the electronic component after the bumps are pressurized against the electrodes.

According to an eighth aspect of the present invention, there is provided an electronic component mounting method for electrically connecting bumps formed on an electronic component to electrodes formed in an electronic component mounting region of a board by metal bonding, comprising:

a thermocompression bonding process for moving down a thermocompression bonding head which holds the electronic component to the board and heating the bumps while pressurizing the bumps against the electrodes of the board; and a resin injection process for injecting a liquid thermosetting resin into a gap between the electronic component mounting region of the board and the electronic component during the thermocompression bonding process, wherein the thermocompression bonding process is continued at least until the gap is filled with the thermosetting resin and the bumps are metallically bonded to the electrodes.

According to a ninth aspect of the present invention, there is provided the electronic component mounting method as defined in the eighth aspect, wherein the thermocompression bonding process is continued until the thermosetting resin filled in the gap is cured.

According to the present invention, during thermocompression bonding of metallically bonding the bumps to the electrodes by heating the electronic component by the thermocompression bonding head, by making the thermosetting resin enter the gap between the electronic component and the board by "capillarity" or injecting the liquid thermosetting resin into the gap between the electronic component and the board during the thermocompression bonding, an electronic component mounting method capable of preventing the occurrence of voids due to the confinement of air bubbles in the sealing resin is provided. Furthermore, the mounting method is capable of reinforcing the bonded portions of the bumps and the electrodes with the thermosetting resin that has already been thermally cured and preventing the breakage of the bonded portions due to the thermal stress generated in the cooling process after metal bonding. Consequently, the mounting method provides excellent bonding reliability after mounting.

BRIEF DESCRIPTION OF THE DRAWINGS

These and other aspects and features of the present invention will become clear from the following description taken in conjunction with the preferred embodiments thereof with reference to the accompanying drawings, in which.

DETAILED DESCRIPTION OF THE INVENTION

Figure 1A:
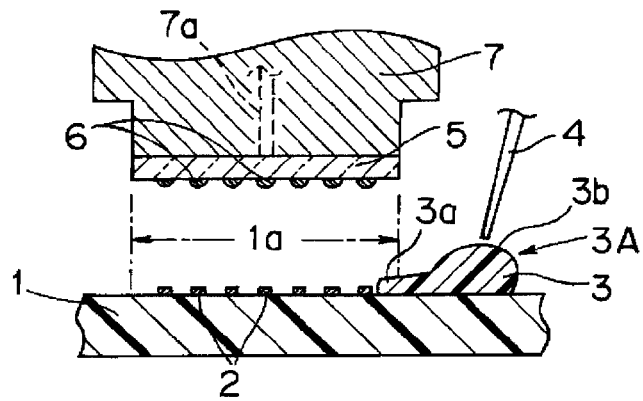
FIG. 1A is an explanatory view of a process of an electronic component mounting method according to a first embodiment of the present invention, showing a state in which a thermosetting resin is placed.

Before the description of the present invention proceeds, it is to be noted that like parts are designated by like reference numerals throughout the accompanying drawings.

Hereinbelow, embodiments of the present invention will be described in detail with reference to the accompanying drawings.

The First Embodiment

FIGS. 1A through 1E are explanatory views of the electronic component mounting method of the present first embodiment of the present invention. FIG. 2A is a schematic explanatory view of the resin arrangement form of the electronic component mounting method of the present first embodiment of the present invention. FIG. 2B is a schematic explanatory view of the resin entry state of the electronic component mounting method of the first embodiment of the present invention. FIGS. 3A and 3B and FIGS. 4A and 4B are schematic explanatory views of the resin arrangement forms according to the modification examples of the electronic component mounting method of the first embodiment.

First of all, the electronic component mounting method of the first embodiment is described with reference to FIGS. 1A through 1E and FIGS. 2A and 2B. In FIG. 1A, an electronic component mounting region 1a in which an electronic component 5 is mounted is set on a surface of a board 1, and a plurality of electrodes 2 are formed in the electronic component mounting region 1a (see also FIG. 2A). Bumps 6 that are connection electrodes are formed of a conductive metal of gold, solder or the like on a bump formation surface that is the lower surface of the electronic component 5. According to the electronic component mounting method of the present first embodiment, the electronic component 5 is sucked and held by a thermocompression bonding head 7 that has a suction hole 7a for sucking and holding the component and a heating means for heating the component, and the bumps 6 are individually electrically connected to the electrodes 2 by metal bonding by pressurizing the electronic component 5 against the board 1 while heating the electronic component 5.

In this case, a variety of bonding methods are applicable as metal bonding. In a case that, for example, gold is used as the material of the bumps 6, a method for solder bonding the bumps 6 to the electrodes 2 with a solder bonding material preparatorily supplied, and a method for metallically bonding the lower end portions of the bumps 6 to the surfaces of the electrodes 2 by pressurizing the bumps 6 against the electrodes 2 plated with gold while heating can be used. Moreover, when solder bumps are used as the bumps 6, the bumps 6 are melted by heating the electronic component 5 by the thermocompression bonding head 7 and solder bonded to the electrodes 2.

At the start of mounting operation, resin placement for sealing a gap between the board 1 and the electronic component 5 with resin is first performed. In this case, a thermosetting resin 3 is placed in a state of a liquid glob 3A on the surface of the board 1 (resin placement process). That is, as shown in FIG. 1A, a liquid glob 3A obtained by applying a liquid thermosetting resin 3 in a liquid glob form of a prescribed shape to the outside of the electronic component mounting region 1a is formed by moving in a two-dimensional plane a dispensing nozzle 4 that discharges the thermosetting resin 3 in the liquid form outside the electronic component mounting region 1a.

At this time, the applying operation of the dispensing nozzle 4 is controlled so that the resin application shape of the thermosetting resin 3 becomes a shape that has a liquid glob body portion 3b of the liquid glob 3A applied to the outside of the electronic component mounting region 1a and a tongue-shaped portion 3a which projects from the liquid glob body portion 3b and of which the end portion reaches the inside of the electronic component mounting region 1a (see FIG. 2A). Then, regarding the resin application shape, the resin application shape is controlled so that a remaining portion (liquid glob body portion 3b), which is obtained by excluding this one portion that has entered the inside of the electronic component mounting region 1a in the form of the tongue-shaped portion 3a of the liquid glob 3A, comes to have a liquid measure greater than that of the tongue-shaped portion. Thereby, a liquid glob distribution state in which the one portion of the liquid glob 3A is arranged inside the electronic component mounting region 1a and the remaining portion of the liquid measure greater than the one portion is arranged outside the electronic component mounting region 1a is provided. Then, the liquid glob distribution state is provided by the resin application shape of the dispensing nozzle 4 in the resin placement process as described above. It is noted in the present specification that the "liquid glob" means a glob where the thermosetting resin in the liquid form gathers in a body and has a state in which the liquid state is maintained and easily flowed by an external force or the like applied thereto.

In the liquid glob distribution state, it is desirable to control the resin application shape so that the tongue-shaped portion 3a that has entered the electronic component mounting region 1a does not cover the electrodes 2 inside the electronic component mounting region 1a. With this arrangement, filler particles included in the thermosetting resin 3 are not interposed in the interfaces between the bumps 6 and the electrodes 2 when the bumps 6 are metallically bonded to the electrodes 2 by being pressurized, and satisfactory metal bonding can be achieved.

Figure 1B:
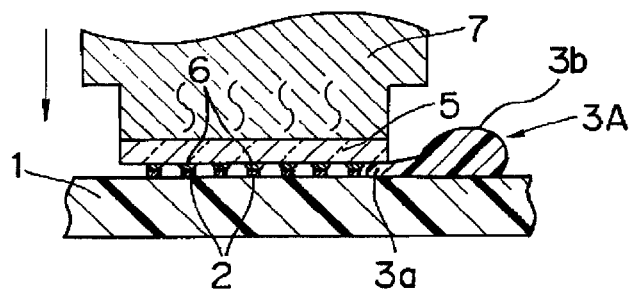
FIG. 1B is an explanatory view of a process of the electronic component mounting method of the first embodiment following FIG. 1A, showing a state in which bumps are thermocompression bonded to electrodes.
Figure 2A:
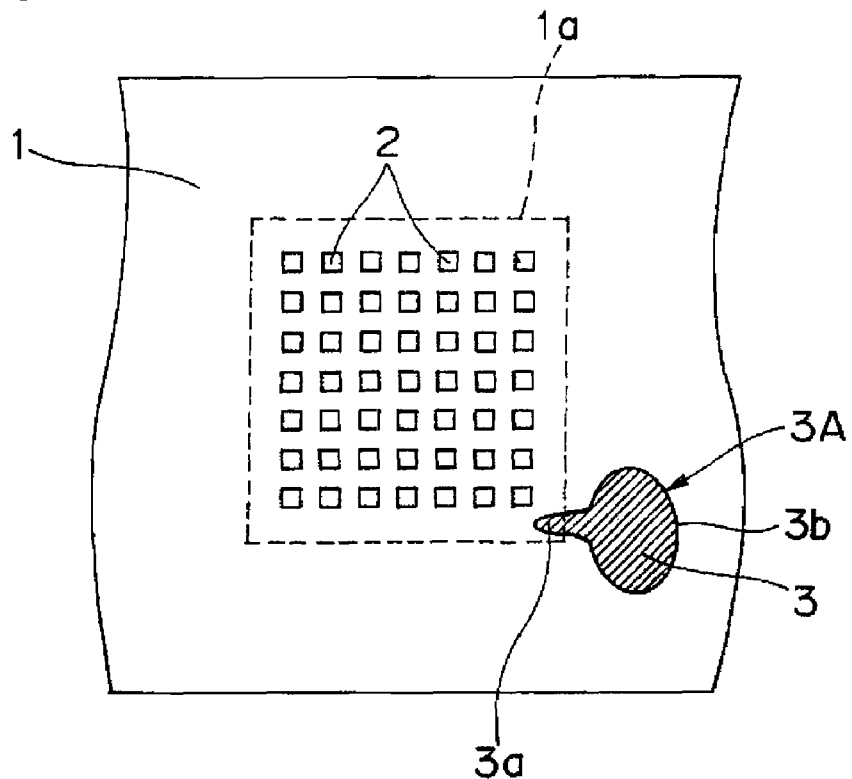
FIG. 2A is a schematic explanatory view of a resin arrangement form of the electronic component mounting method of the first embodiment, showing a state in which a liquid glob is placed.
Figure 2B:
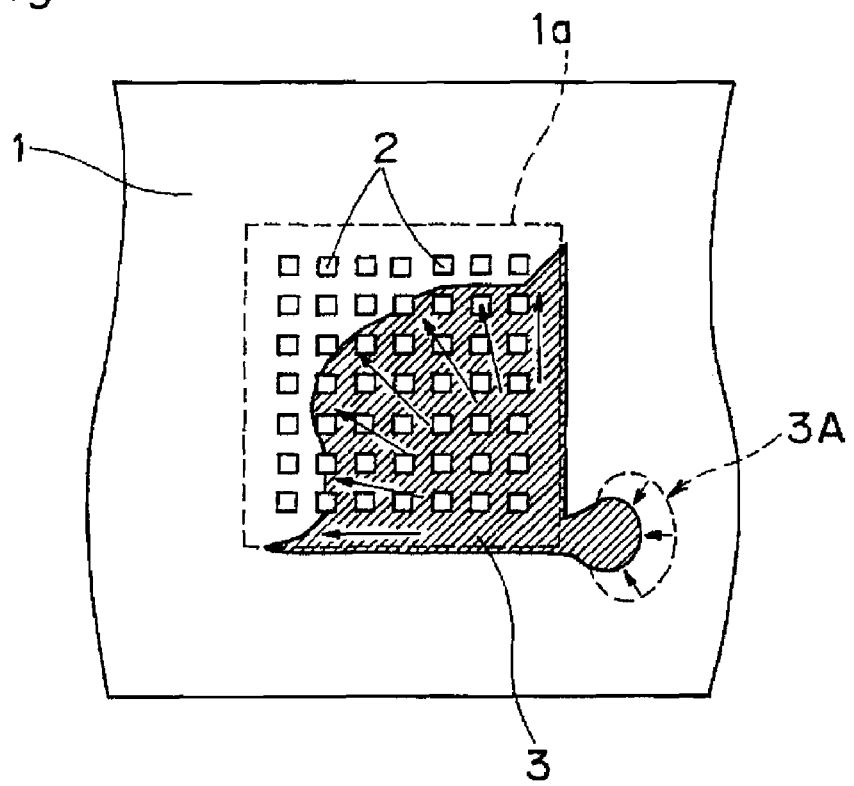
FIG. 2B is a schematic explanatory view of a resin entry state of the electronic component mounting method of the first embodiment, showing a state in which the resin enters a gap between the electronic component and the board.

Next, as shown in FIG. 1B, the bumps 6 are aligned in position with the electrodes 2, and the thermocompression bonding head 7 that holds the electronic component 5 is moved down to the board 1, bringing the bumps 6 into contact with the electrodes 2. In this stage, heating of the bumps 6 by the thermocompression bonding head 7 has already started, and the bumps 6 are in a heated state at the point of time when the bumps 6 are brought into contact with the thermosetting resin 3. As a result, the lower surface of the electronic component 5 is brought into contact with the tongue-shaped portion 3a of the thermosetting resin 3 that has reached the inside of the electronic component mounting region 1a, and the bumps 6 are pressurized against the electrodes 2 (contact process). In the contact process, either of the timing of bringing the bumps 6 into contact with the electrodes 2 and the timing of bringing the lower surface of the electronic component 5 into contact with the thermosetting resin 3 may precede so long as they occur almost simultaneously or occur completely simultaneously.

Figure 1C:
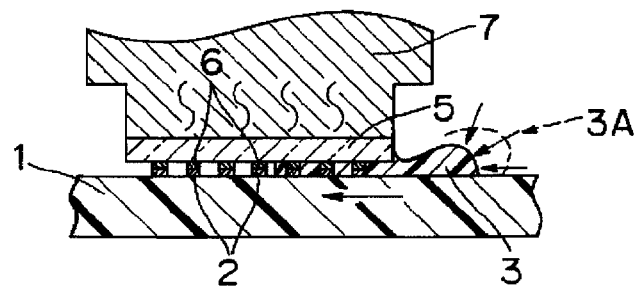
FIG. 1C is an explanatory view of a process of the electronic component mounting method of the first embodiment following FIG. 1B, showing a state in which the thermosetting resin enters a gap between an electronic component and a board.

Next, a heating process of pressurizing the bumps against the board 1 while heating the bumps 6 by the thermocompression bonding head 7 is started. In the heating process, as shown in FIG. 1C, the bumps 6 and electrodes 2 are metallically bonded together by heating the electronic component 5 by the thermocompression bonding head 7 in a state in which the bumps 6 are brought into contact with the electrodes 2. Concomitantly, by carrying out the heating process, the entry of the thermosetting resin 3 into the gap between the electronic component 5 and the board 1 is promoted (first heating process described later), and thereafter, the thermosetting reaction of the thermosetting resin 3 that has thus entered the gap and filled is promoted (second heating process described later).

That is, when the tongue-shaped portion 3a is brought into contact with the electronic component 5 in the heated state, the temperature of the thermosetting resin 3 in the portion rises, by which the viscosity is reduced to increase the flowability. As a result, the thermosetting resin 3 starts entering the gap between the board 1 and the electronic component 5 by capillarity. Then, as the thermosetting resin 3 spreads from the portion of the tongue-shaped portion 3a into the gap by capillarity as shown in FIG. 2B, the thermosetting resin 3 of the liquid glob 3A located outside the electronic component mounting region 1a is heated and attracted into the gap with reducing viscosity, and the liquid glob 3A gradually becomes reduced in size. As a result, the greater part of the thermosetting resin 3 supplied initially in the form of the liquid glob 3A enters the gap between the board 1 and the electronic component 5 and seals the gap.

It is noted that the thermosetting resin 3 used here is in the liquid form during the bonding process for metallically bonding the electrodes 2 and the bumps 6 together and until the resin finishes entering at least the gap between the lower surface of the electronic component 5 and the board 1 in the heating process and has its constituent adjusted to cure by subsequently continuing the heating process. By using the thermosetting resin 3 of which the constituent is thus adjusted, the heating process is performed in two processes. In concrete, in the first heating process, the heating of the thermosetting resin 3 is performed at a temperature of not higher than the curing temperature of the thermosetting resin 3 at which the viscosity of the resin can be sufficiently reduced, or in other words, at a temperature at which the entry of the thermosetting resin 3 into the gap between the board 1 and the electronic component 5 is promoted by utilizing capillarity, filling the resin 3 into the gap. Thereafter, heating is performed at a temperature higher than the curing temperature of the thermosetting resin 3 in the second heating process, reliably thermosetting the resin 3 filled in the gap.

Moreover, by incorporating a filler constituent of silica, alumina or the like that has a thermal expansion coefficient smaller than that of the resin constituent into the thermosetting resin 3, reduction in reliability can be prevented by relaxing the thermal stress in the heat cycle. As the thermosetting resin, it is preferable to use, for example, one that has physical properties of a gel time of 30 seconds to 180 seconds at 150° C. and a viscosity of 100 mPa·s to 100,000 mPa·s at 25° C. As a concrete example, a CHIPCOAT U8433L (registered trademark in Japan) (gel time at 150° C. is 110 sec, viscosity at 25° C. is 8 Pa·s) produced by NAMICS CORPORATION can be enumerated.

Figure 1D:
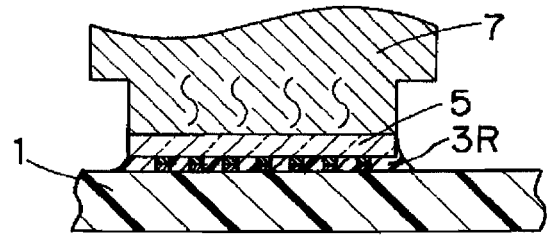
FIG. 1D is an explanatory view of a process of the electronic component mounting method of the first embodiment following FIG. 1C, showing a state in which the resin is thermally cured.
Figure 1E:
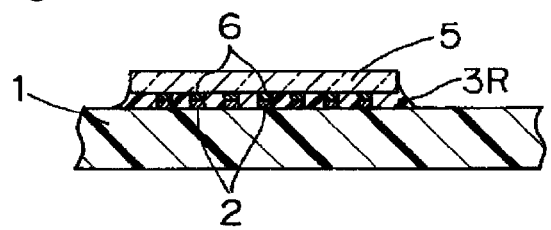
FIG. 1E is an explanatory view of a process of the electronic component mounting method of the first embodiment following FIG. 1D, showing a state in which the electronic component is mounted on the board.

After the first heating process for filling the gap with the thermosetting resin 3 is carried out, the second heating process is carried out by setting the heating temperature higher than the curing temperature of the resin while continuing the heating and pressurizing by the thermocompression bonding head 7 as shown in FIG. 1D. By carrying out the second heating process, the thermosetting reaction of the thermosetting resin 3 proceeds. As a result, a resin reinforcement member 3R that reinforces the peripheries of the bonded portions where the bumps 6 are metallically bonded to the electrodes 2 with the cured thermosetting resin 3 is formed in between the board 1 and the electronic component 5. Then, after the heating process, the thermocompression bonding head 7 is moved up and away from the electronic component 5 as shown in FIG. 1E (thermocompression bonding head moving-away process). Then, by subsequently cooling the electronic component 5 to the normal temperature, all the processes of the electronic component mounting for electrically connecting the bumps 6 formed on the electronic component 5 to the electrodes 2 by metal bonding completed.

Although the thermal stress caused by the thermal expansion coefficient difference between the board 1 and the electronic component 5 takes effect on the bonded portions of the bumps 6 and the electrodes 2 during the cooling process, the problems of breakage of the bonded portions and so on due to the thermal stress do not occur since the peripheries of the bonded portions are reinforced by the resin reinforcement member 3R as described above. Then, since the thermosetting resin 3 is made to intrude from the end portion to the inside of the electronic component mounting region 1a by capillarity during the process of making the thermosetting resin 3 enter the gap between the board 1 and the electronic component 5, the air in the gap is discharged to the outside by the intruding thermosetting resin 3. Therefore, voids do not occur due to air bubbles left in the gap between the board 1 and the electronic component 5.

Moreover, the electronic component 5 is held by the thermocompression bonding head 7 by the holding power of vacuum suction and a frictional force with the electronic component 5 during the process in which the thermosetting resin 3 enters the gap between the electronic component 5 and the board 1. This therefore prevents the occurrence of lift and displacement of the electronic component 5 due to the flow of the thermosetting resin 3 and makes it possible to effectively prevent the problems such as bonding failure caused by the displacement and so on even in a case in which a thin type electronic component that easily causes warp deformation due to heat is the objective.

Furthermore, since the electronic component 5 is brought into contact with the thermosetting resin 3 by moving down the electronic component 5 to the board 1, a timing difference between the timing at which the electronic component 5 is mounted and the timing at which the thermosetting resin 3 starts entering the gap between the board 1 and the electronic component 5 is small, and timing variation is little. Therefore, the state of entry of the thermosetting resin 3 into the gap can be kept uniform, and this facilitates quality control to provide stable electronic component mounting quality in mass production.

Although the heating process is continued until the thermosetting resin 3 is cured in the present first embodiment, the heating process may be ended without waiting for the complete curing of the thermosetting resin 3 as a consequence of the completion of the thermosetting reaction if the thermosetting resin 3 is cured to a degree that the effect of reinforcing the bonded portions of the bumps 6 and the electrodes 2 is obtained. That is, it is successful that the thermosetting reaction of the thermosetting resin 3 progresses to some degree and the reinforcing effect of the bonded portions by virtue of the resin reinforcement member 3R reaches a level sufficient for a load to the bonded portions due to the thermal stress during the cooling process.

Moreover, although the shape of the tongue-shaped portion 3a projecting from one liquid glob 3A of an approximately round hill shape is described as the shape of the liquid glob formed by applying the thermosetting resin onto the board 1 in the present first embodiment described above, the shape of the liquid glob is not limited to this. A variety of shapes according to, for example, the modification examples shown in FIGS. 3A, 3B, 4A and 4B can be adopted.

Figure 3A:
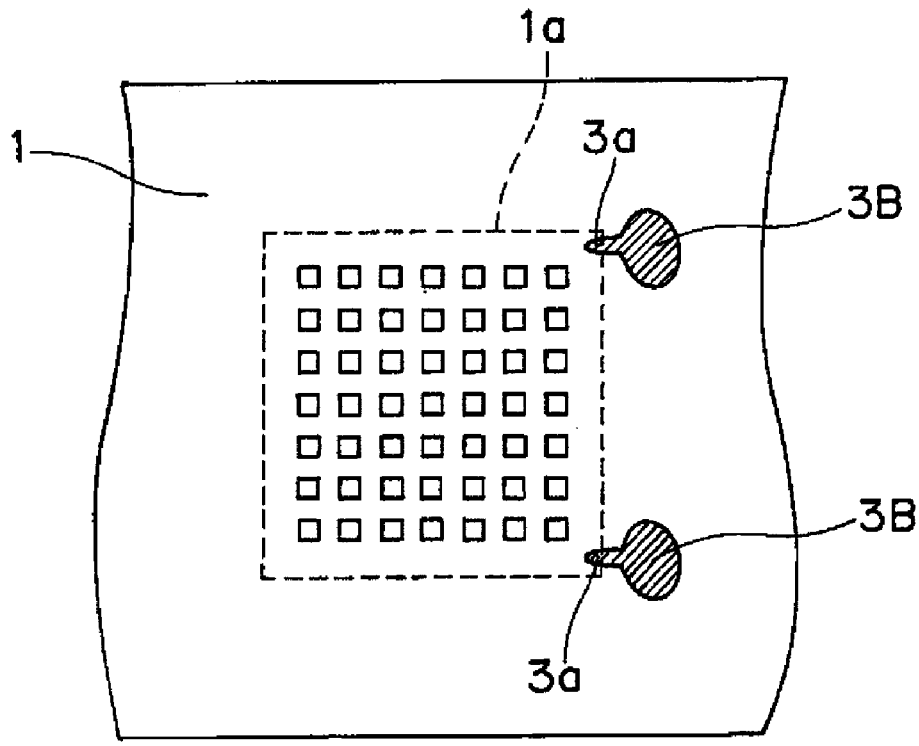
FIG. 3A is a schematic explanatory view of a resin arrangement form according to a modification example of the electronic component mounting method of the first embodiment.
Figure 3B:
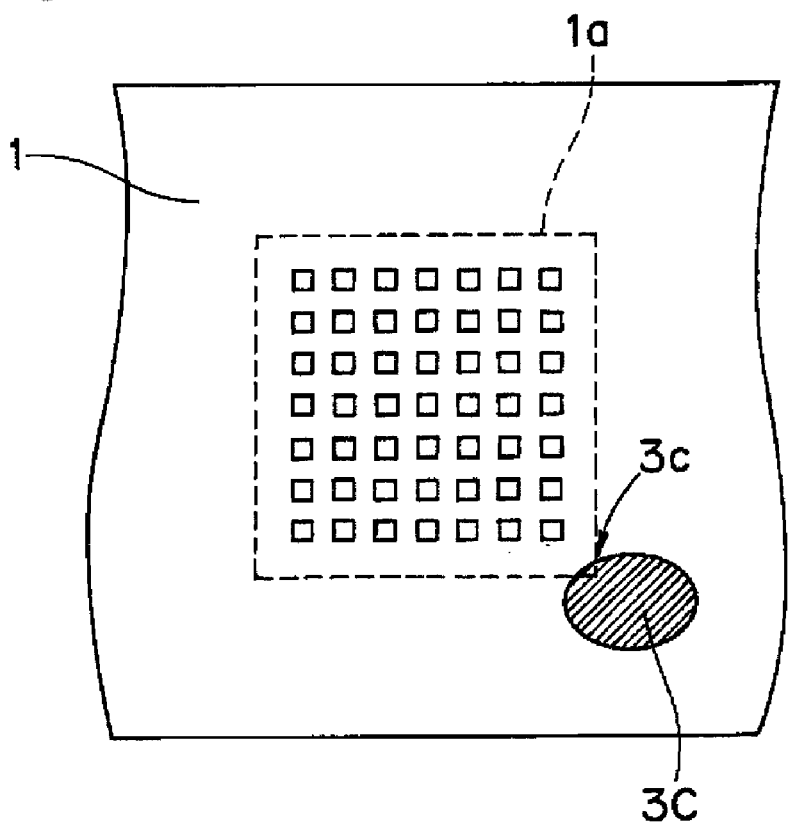
FIG. 3B is a schematic explanatory view of a resin arrangement form according to a modification example of the electronic component mounting method of the first embodiment.

FIG. 3A shows an example in which liquid globs 3B of liquid measures obtained by dividing one liquid glob 3A into two parts are formed at two corner portions of the electronic component mounting region 1a. A tongue-shaped portion 3a whose end portion reaches the inside of the electronic component mounting region 1a is provided for each liquid glob 3B as in the liquid glob 3A. Moreover, a liquid glob 3C shown in FIG. 3B is provided by setting the resin application shape so that one portion 3c of the liquid glob 3C is located inside the electronic component mounting region 1a without providing the tongue-shaped portion 3a in a liquid glob of an approximately round hill shape similar to the liquid glob 3A.

Figure 4A:
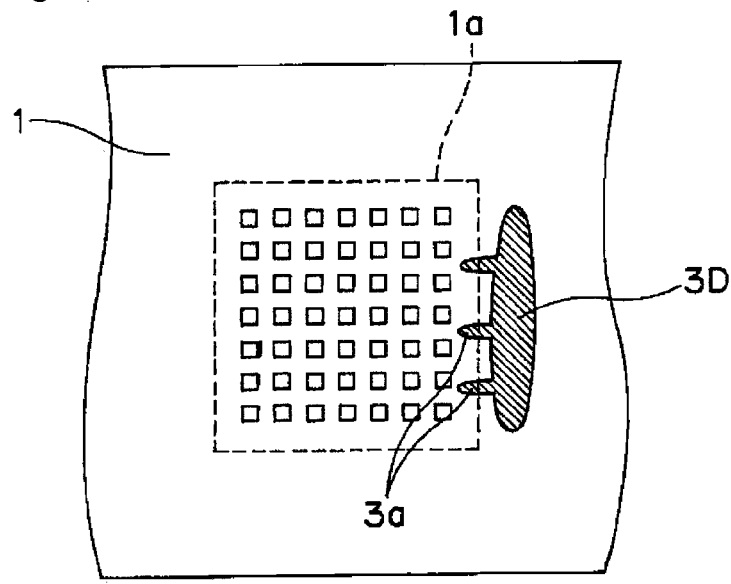
FIG. 4A is a schematic explanatory view of a resin arrangement form according to a modification example of the electronic component mounting method of the first embodiment.
Figure 4B:
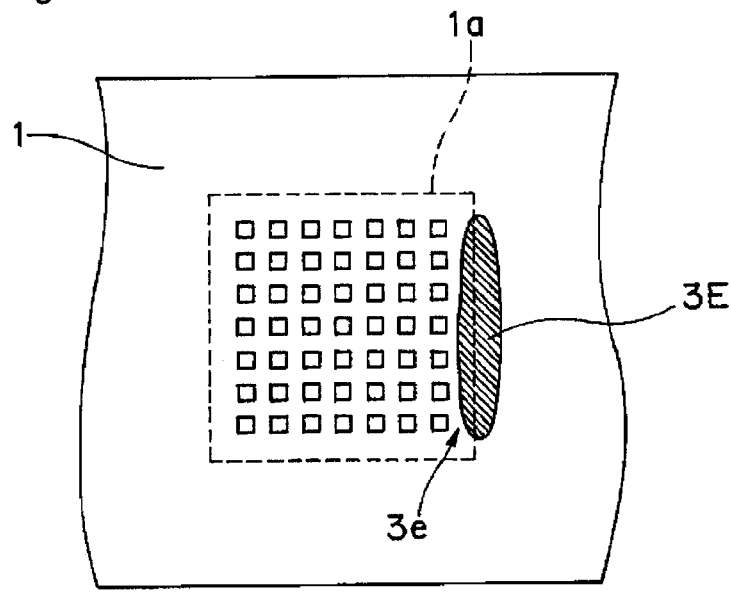
FIG. 4B is a schematic explanatory view of a resin arrangement form according to a modification example of the electronic component mounting method of the first embodiment.

Then, FIG. 4A shows an example in which a liquid glob 3D of an oval hill shape elongated in one direction is placed outside the electronic component mounting region 1a along one side of the electronic component mounting region 1a in place of the liquid glob 3A of an approximately round hill shape. The liquid glob 3D has a plurality of tongue-shaped portions 3a whose end portions reach the inside of the electronic component mounting region 1a. Further, in an example shown in FIG. 4B in which a liquid glob 3E of an oval hill shape is placed along one side of the electronic component mounting region 1a, the resin application shape is set so that one portion 3e of the liquid glob 3E is partially located inside the electronic component mounting region 1a without providing the tongue-shaped portion 3a. Each of the examples shown in FIGS. 3A, 3B, 4A and 4B has a liquid glob distribution state in which a portion of the liquid glob is placed inside the electronic component mounting region 1a, and the remaining portion of a liquid measure greater than that of the portion is located outside the electronic component mounting region 1a.

The Second Embodiment

The present invention is not limited to the first embodiment but allowed to be put into practice in various other modes. For example, an electronic component mounting method according to the second embodiment of the present invention is described with reference to the drawings.

Figure 5A:
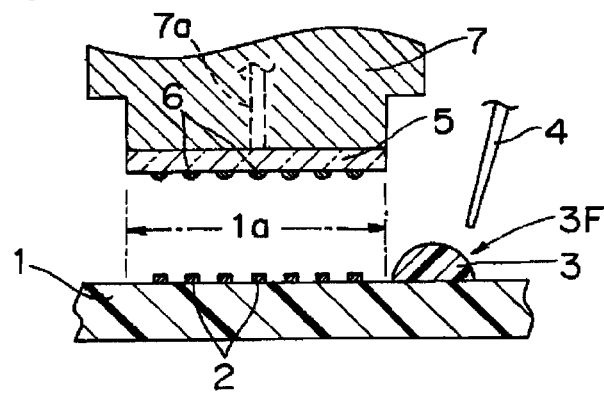
FIG. 5A is an explanatory view of a process of the electronic component mounting method according to a second embodiment of the present invention, showing a state in which a thermosetting resin is placed.
Figure 5B:
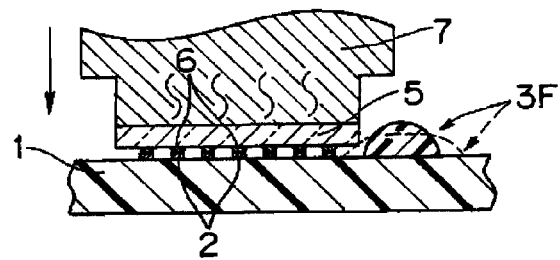
FIG. 5B is an explanatory view of a process of the electronic component mounting method of the second embodiment following FIG. 5A, showing a state in which bumps are thermocompression bonded to electrodes.
Figure 5C:
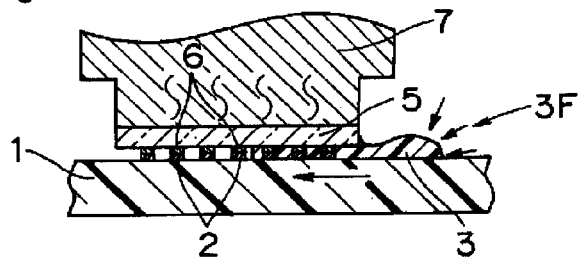
FIG. 5C is an explanatory view of a process of the electronic component mounting method of the second embodiment following FIG. 5B, showing a state in which the thermosetting resin enters a gap between an electronic component and a board.
Figure 5D:
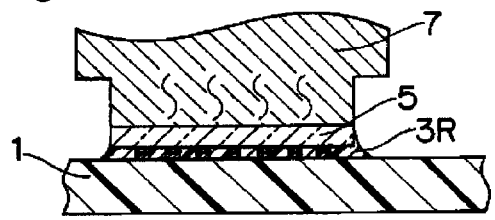
FIG. 5D is an explanatory view of a process of the electronic component mounting method of the second embodiment following FIG. 5C, showing a state in which the resin is thermally cured.
Figure 5E:
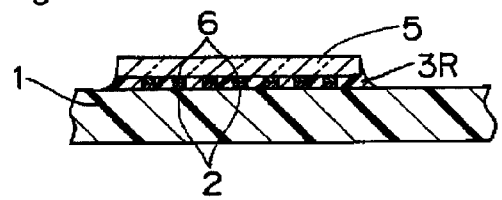
FIG. 5E is an explanatory view of a process of the electronic component mounting method of the second embodiment following FIG. 5D, showing a state in which the electronic component is mounted on the board.
Figure 6A:
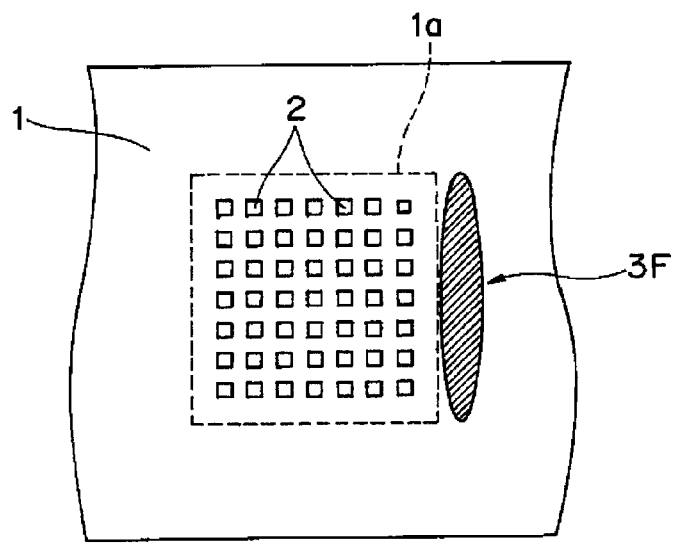
FIG. 6A is a schematic explanatory view of a resin arrangement form of the electronic component mounting method of the second embodiment, showing a state in which the thermosetting resin is placed outside an electronic component mounting region.
Figure 6B:
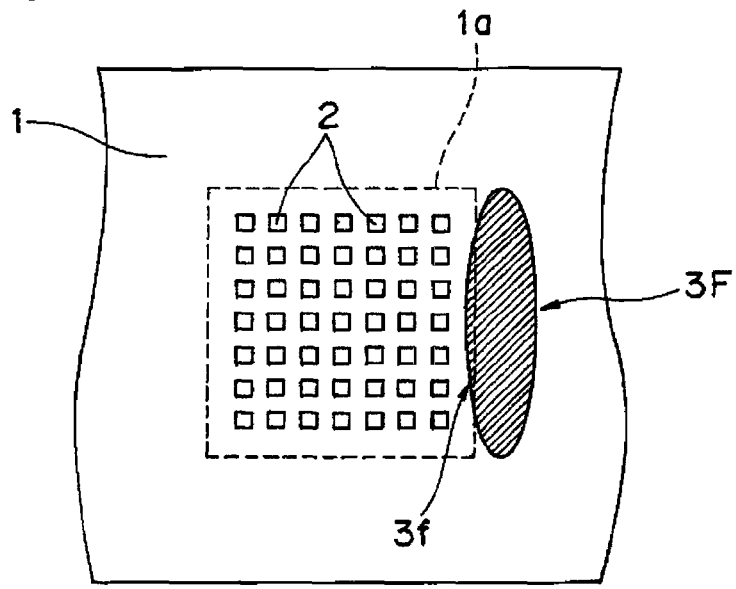
FIG. 6B is a schematic explanatory view of a resin arrangement form of the electronic component mounting method of the second embodiment, showing a state in which a part of the resin has flowed into the electronic component mounting region.

FIGS. 5A through 5E are explanatory views of the steps of the electronic component mounting method of the present second embodiment, and FIGS. 6A and 6B are schematic explanatory views of the resin arrangement forms of the electronic component mounting method of the present second embodiment. According to the electronic component mounting method of the present second embodiment, the resin placement process is carried out prior to the mounting of the electronic component 5 onto the board 1 as in the first embodiment, whereas a thermosetting resin 3 is applied in a liquid glob distribution state different from that of the first embodiment.

In FIG. 5A, an electronic component mounting region 1a in which an electronic component 5 is mounted is set on a surface of a board 1, and a plurality of electrodes 2 are formed in the electronic component mounting region 1a. Bumps 6 that are electrodes for connection are formed on a bump formation surface that is the lower surface of an electronic component 5.

At the start of the mounting operation of the electronic component 5, a resin for use in sealing a gap between the board 1 and the electronic component 5 with the resin is first placed as in the first embodiment. In this case, the thermosetting resin 3 is placed in a state of a liquid glob 3F on the surface outside the electronic component mounting region 1$a$ of the board 1 (resin placement process). That is, as shown in FIG. 5A, a liquid glob 3F obtained by applying a liquid thermosetting resin 3 in a liquid glob form of a prescribed shape to the outside of the electronic component mounting region 1$a$ is formed by moving in a two-dimensional plane a dispensing nozzle 4 that discharges the thermosetting resin 3 in the liquid form outside the electronic component mounting region 1$a$.

At this time, the applying operation of the dispensing nozzle 4 is controlled so that the resin application shape of the thermosetting resin 3 becomes a shape such that the whole body of the liquid glob 3F is located outside the electronic component mounting region 1$a$ as shown in FIG. 6A. At this time, the thermosetting resin starts flowing immediately after the formation of the liquid glob, and the liquid glob 3F starts spreading to the surroundings. Then, as time elapses, a portion 3$f$ of the liquid glob 3F spread by the flowing flows so as to reach the edge portion of the electronic component mounting region 1$a$ as shown in FIG. 6B (resin flow process).

Concurrently with the resin flow process, as shown in FIG. 5B, by moving a thermocompression bonding head 7 that holds the electronic component 5 with the bumps 6 aligned in position with the electrodes 2 to the board 1, the bumps 6 are brought into contact with and pressurized against the electrodes 2 (pressurizing process). Concomitantly, the lower surface of the electronic component 5 is brought into contact with the thermosetting resin 3 that has flowed into the electronic component mounting region 1$a$ (resin contact process). In the present second embodiment, the contact process is constituted of the resin flow process, the pressurizing process and the resin contact process. In the contact process, a timing at which the bumps 6 are brought into contact with the electrodes 2 and a timing at which the lower surface of the electronic component 5 is brought into contact with the thermosetting resin 3 that has flowed into the electronic component mounting region 1$a$ may be almost simultaneous. However, it is preferable to bring the thermosetting resin 3 that has flowed into the electronic component mounting region 1$a$ into contact with the electronic component 5 after the bumps 6 are brought into contact with and pressurized against the electrodes 2. That is, although the resin flow process, the pressurizing process and the resin contact process may be carried out at almost simultaneous timing in the contact process, it is more preferable that the pressurizing process is carried out and thereafter the resin flow process and the resin contact process are carried out.

With this arrangement, the problem of the filler being interposed between the bumps 6 and the electrodes 2 can reliably be prevented, and the occurrence of voids due to air bubbles left in between the electronic component 5 and the board 1 can be suppressed. It is noted that the timing at which the thermosetting resin 3 and the electronic component 5 are brought into contact with each other can be controlled by adjusting the shape and the liquid glob placement position of the liquid glob 3F according to the resin placement conditions, i.e., the properties of the thermosetting resin 3 used.

Next, the heating process of pressurizing the bumps 6 against the board 1 while heating the bumps by the thermocompression bonding head 7 is started. In the heating process, as shown in FIG. 5C, the bumps 6 are metallically bonded to the electrodes 2 by heating the electronic component 5 by the thermocompression bonding head 7 in a state in which the bumps 6 are put into contact with the electrodes 2, and the entry of the thermosetting resin 3 into the gap between the electronic component 5 and the board 1 as well as the thermosetting reaction of the entered thermosetting resin 3 are promoted.

That is, when the thermosetting resin 3 that has flowed into the electronic component mounting region 1$a$ is brought into contact with the electronic component 5 in the heated state, the temperature of the thermosetting resin 3 of the portion is raised, and the flowability increases with reduced viscosity. As a result, the thermosetting resin 3 starts entering the gap between the board 1 and the electronic component 5 by capillarity as in the first embodiment. Then, as the thermosetting resin 3 spreads in the gap, the thermosetting resin 3 of the liquid glob 3F located outside the electronic component mounting region 1$a$ is heated and attracted into the gap with the viscosity reduced by heating, and the liquid glob 3F gradually becomes reduced in size. As a result, the greater part of the thermosetting resin 3 placed in the form of the liquid glob 3F outside the electronic component mounting region 1$a$ enters the gap between the board 1 and the electrodes 2 and seals the gap.

Subsequently, by continuing heating and pressurizing by the thermocompression bonding head 7 as shown in FIG. 5D, the thermosetting reaction of the thermosetting resin 3 progresses. As a result, a resin reinforcement member 3R that reinforces the peripheries of the bonded portions where the bumps 6 are metallically bonded to the electrodes 2 with the cured thermosetting resin 3 is formed in between the board 1 and the electronic component 5. Then, after the heating process, the thermocompression bonding head 7 is moved up and away from the electronic component 5 as shown in FIG. 5E (thermocompression bonding head moving-away process). Then, by subsequently cooling the electronic component 5 to the normal temperature, all the processes of the electronic component mounting for electrically connecting the bumps 6 formed on the electronic component 5 to the electrodes 2 by metal bonding is completed.

Also in the present second embodiment, an effect similar to that of the first embodiment can be obtained. The present second embodiment is useful in a case where a thermosetting resin with a comparatively easy flowability is used or in a case where a time interval cannot be avoided during a time from the resin placement process to the contact of the bumps with the electrodes and there is a concern that the thermosetting resin will flow beyond the limit. That is, when a thermosetting resin 3 of an intense flowability is applied to the inside of the electronic component mounting region 1$a$, there is concern that problems of filler interposing as a consequence of the coverage of the electrodes 2 with the thermosetting resin 3 that has excessively flowed and so on might occur. However, by placing the liquid glob 3A outside the electronic component mounting region 1$a$ as in the present second embodiment, the occurrence of such problems can be prevented.

Also in the present second embodiment, the heating process is continued until the thermosetting resin 3 is cured. However, if the thermosetting resin 3 is cured to a degree that the effect of reinforcing the bonded portions of the bumps 6 and the electrodes 2 is obtained as in the first embodiment, the heating process may be ended without waiting for the complete curing of the thermosetting resin 3 after the completion of the thermosetting reaction.

The Third Embodiment

An electronic component mounting method according to the third embodiment of the present invention is described next with reference to the drawings. FIGS. 7A through 7E are schematic process charts of the electronic component mounting method of the present third embodiment. According to the electronic component mounting method of the present third embodiment, the thermosetting resin 3, which has preparatorily been supplied prior to the mounting of the electronic component in the first embodiment and the second embodiment, is supplied in a thermocompression bonding process.

Figure 7A:
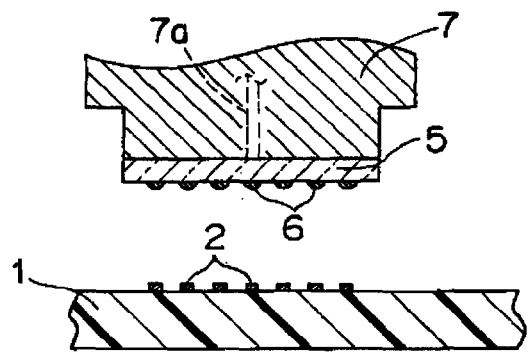
FIG. 7A is an explanatory view of a process of an electronic component mounting method according to a third embodiment of the present invention, showing a state in which the electronic component and the board are positioned.

In FIG. 7A, a plurality of electrodes 2 are formed on a board 1. An electronic component 5 is similar to that shown in the first embodiment, and bumps 6 that are the electrodes for connection are formed on its lower surface. Also by the electronic component mounting method of the present third embodiment, the bumps 6 are electrically connected to the electrodes 2 by metal bonding by pressurizing the electronic component 5 against the board 1 while sucking and holding the electronic component by a thermocompression bonding head 7 similar to the methods of the first and second embodiments.

Figure 7B:
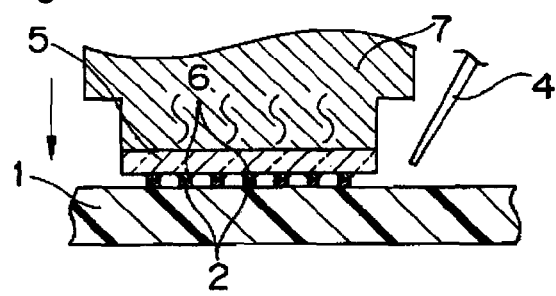
FIG. 7B is an explanatory view of a process of the electronic component mounting method of the third embodiment following FIG. 7A, showing a state in which bumps are thermocompression bonded to electrodes.

At the start of the mounting operation of the electronic component 5, the bumps 6 are first aligned in position with the electrodes 2, and as shown in FIG. 7B, the thermocompression bonding head 7 that is holding the electronic component 5 is moved down to the board 1, pressurizing the bumps 6 against the electrodes 2 while heating (thermocompression bonding process). At this time, the heating of the electronic component 5 by the thermocompression bonding head 7 has already started, and the electronic component 5 is in a heated state. Then, a dispensing nozzle 4 for resin injection is moved to a side of the thermocompression bonding head 7 and put in a state in which the resin can be discharged.

Figure 7C:
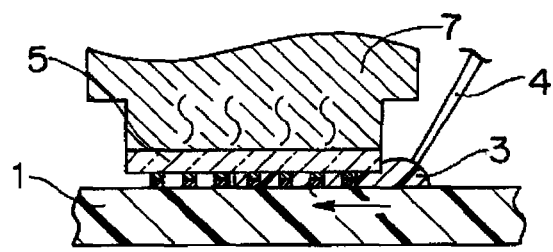
FIG. 7C is an explanatory view of a process of the electronic component mounting method of the third embodiment following FIG. 7B, showing a state in which the thermosetting resin is injected into a gap between an electronic component and a board.

Then, as shown in FIG. 7C, the thermosetting resin 3 in a liquid form is discharged from the dispensing nozzle 4, injecting the thermosetting resin 3 into a gap between the electronic component 5 and the board 1 (resin injection process). At this time, the thermosetting resin is fluidized by coming in contact with the heated electronic component 5 and enters the gap by capillarity as in the first embodiment.

Figure 7D:
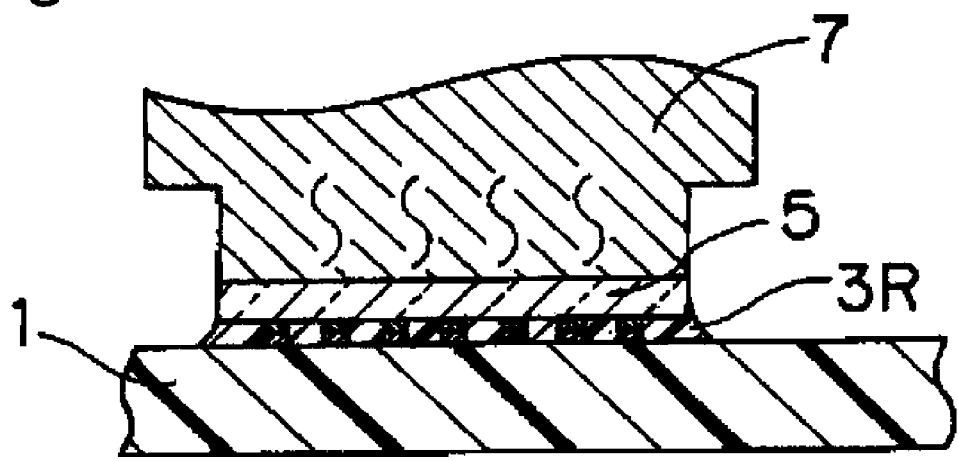
FIG. 7D is an explanatory view of a process of the electronic component mounting method of the third embodiment following FIG. 7C, showing a state in which the resin is thermally cured.
Figure 7E:
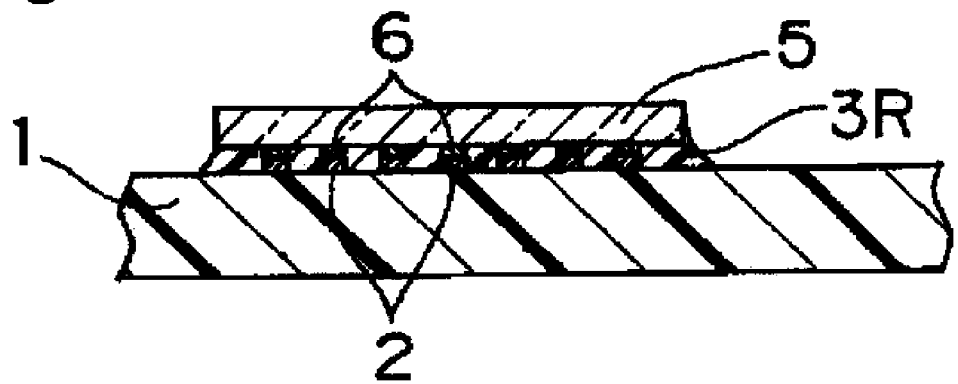
FIG. 7E is an explanatory view of a process of the electronic component mounting method of the third embodiment following FIG. 7D, showing a state in which the electronic component is mounted on the board.

Then, by continuing heating and pressurization by the thermocompression bonding head 7 as shown in FIG. 7D, the thermosetting reaction of the thermosetting resin 3 proceeds. As a result, a resin reinforcement member 3R that reinforces the peripheries of the bonded portions where the bumps 6 are metallically bonded to the electrodes 2 with the cured thermosetting resin 3 is formed in between the board 1 and the bumps 6. Then, after the thermocompression bonding process, the thermocompression bonding head 7 is moved up to stop the heating and pressurization of the electronic component 5 as shown in FIG. 7E. Then, by cooling the electronic component 5 to the normal temperature, all the processes of the electronic component mounting for electrically connecting the bumps 6 formed on the electronic component 5 to the electrodes 2 by metal bonding is completed as in the first embodiment.

Also in the present third embodiment, if the thermosetting resin 3 is cured to a degree that the effect of reinforcing the bonded portions of the bumps 6 and the electrodes 2 is obtained as in the first and second embodiments, the thermocompression bonding process may be ended without waiting for the complete curing of the thermosetting resin 3 after the completion of the thermosetting reaction. That is, in the present third embodiment, the thermocompression bonding process is continued at least until the gap between the electronic component 5 and the board 1 is filled with the thermosetting resin 3, and the bumps 6 and the electrodes 2 are metallically bonded together.

As described above, according to the electronic component mounting method described in the first embodiment through the third embodiment, the thermosetting resin 3 is made to enter the gap between the electronic component 5 and the board 1 by capillarity during the thermocompression bonding for metallically bonding the bumps 6 to the electrodes 2, or the thermosetting resin 3 is injected into the gap between the electronic component 5 and the board 1 during the thermocompression bonding. As a result, during the electronic component mounting for bonding the bumps to the electrodes and sealing the gap between the electronic component and the board with a resin by either the "postcoating" or "precoating" resin placing method, the following problems that have occurred can be prevented.

That is, the "postcoating" for injecting the sealing resin after the metal bonding of the bumps and the electrodes sometimes causes a case where the thermal stress takes effect on the bonded portions of the bumps and the electrodes during the cooling process after the metal bonding, and minute cracks and breakage occur in the bonded portions before the resin sealing is performed. In contrast to this, according to the electronic component mounting method of the present invention, the peripheries of the bonded portions of the bumps and the electrodes are reinforced with the sealing resin that has already been thermally cured during the cooling process after the metal bonding, and therefore, neither breakage nor cracks of the bonded portions is caused by the thermal stress. The effect becomes remarkable in accordance with the reductions in size and pitch due to the downsizing of electronic components and also particularly when lead-free solder is adopted in the case of bonding the bumps with solder.

Moreover, the "precoating" for applying the sealing resin before the mounting of the electronic component tends to generate voids due to air bubbles mixed in the sealing resin, not only impairing the strength of the sealing resin as the resin reinforcement member but also causing damage to the component as a consequence of breakage due to the expansion of the internal gas in the case where heating is performed after mounting. In contrast to this, the electronic component mounting method of the present invention, by which the sealing resin in the liquid form is made to enter the gap between the electronic component and the board from the end portion of the electronic component mounting region, does not leave air as bubbles in the gap and is, therefore, able to prevent the occurrence of voids. Furthermore, according to the electronic component mounting method of the present invention, the thermosetting resin is made to enter the gap between the board and the electronic component in the state in which the bumps are put into contact with the electrodes. Therefore, even if a resin including a filler for adjusting the physical properties after bonding is used, the problem that the filler is interposed in between the bumps and the electrodes can be prevented from occurring.

It is to be noted that, by properly combining the arbitrary embodiments of the aforementioned various embodiments, the effects possessed by them can be produced.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

The entire disclosure of Japanese Patent Application No. 2005-306122 filed on Oct. 20, 2005, including specification, drawings and claims for patent, is incorporated herein by reference in its entirety.

The electronic component mounting method of the present invention has the effect that the bonding reliability after mounting can be secured and is useful for the field in which mounting is carried out by electrically connecting the bumps formed on the electronic component to the electrodes formed on the board by metal bonding.

The invention claimed is:

1. An electronic component mounting method for electrically connecting bumps formed on an electronic component to electrodes formed in an electronic component mounting region on a board by metal bonding, comprising:

placing a liquid thermosetting resin in a liquid glob state on a surface of the board so that one portion of the thermosetting resin is arranged inside the electronic component mounting region and a remaining portion of a liquid measure of the thermosetting resin greater than that of the one portion is arranged outside the electronic component mounting region;

after said placing of the liquid thermosetting resin, moving down a thermocompression bonding head which holds the electronic component to the board, and then bringing a bump formation surface of the electronic component into contact with the one portion of the thermosetting resin in the liquid glob state while pressurizing the bumps against the electrodes of the board;

carrying out metal bonding of the bumps and the electrodes by heating the electronic component by the thermocompression bonding head in a state in which the bumps are pressurized against the electrodes, while heating the thermosetting resin so that entry of the thermosetting resin in the liquid glob state into a gap between the board and the electronic component in the electronic component mounting region is promoted and thermosetting reaction of the thermosetting resin which has entered the gap is promoted, thereby bonding the electronic component to the board via cured thermosetting resin; and then moving the thermocompression bonding head away from the electronic component, thereby mounting the electronic component on the board.

2. The electronic component mounting method as defined in claim 1, wherein the one portion of the thermosetting resin in the liquid glob state is placed so as not to cover the electrodes of the board in the electronic component mounting region.

3. The electronic component mounting method as defined in claim 1, wherein the liquid thermosetting resin is placed by applying the thermosetting resin onto the surface of the board, and a shape of the liquid glob such that the one portion of the liquid glob is arranged in the electronic component mounting region and the remaining portion of the greater liquid measure of the thermosetting resin is arranged outside the electronic component mounting region is formed by the application of the thermosetting resin.

4. The electronic component mounting method as defined in claim 3, wherein the liquid glob of the thermosetting resin is formed by applying the thermosetting resin into an integrated shape comprising a liquid glob body portion arranged outside the electronic component mounting region and a tongue-shaped portion which projects from the liquid glob body portion and has a end portion reaching the inside of the electronic component mounting region.

5. The electronic component mounting method as defined in claim 1, wherein heating of the thermosetting resin by the thermocompression bonding head is continuously performed until the thermosetting resin is cured.

6. The electronic component mounting method as defined in claim 1, wherein said placing of the liquid thermosetting resin, said moving down of the thermocompression bonding head, and said carrying out of the metal bonding of the bumps are performed such that the entry of the thermosetting resin into the gap is via capillary action.

* * * * *